(12) United States Patent
Kobayashi

(10) Patent No.: US 8,919,138 B2
(45) Date of Patent: Dec. 30, 2014

(54) PACKAGED BEVERAGE TEMPERATURE ADJUSTMENT APPARATUS

(75) Inventor: Takahide Kobayashi, Machida (JP)

(73) Assignee: Tex E.G. Co., Ltd., Tokyo (JP)

( * ) Notice: Subject to any disclaimer, the term of this patent is extended or adjusted under 35 U.S.C. 154(b) by 204 days.

(21) Appl. No.: 13/050,764

(22) Filed: Mar. 17, 2011

(65) Prior Publication Data

US 2011/0167839 A1 Jul. 14, 2011

Related U.S. Application Data

(63) Continuation of application No. PCT/JP2009/065930, filed on Sep. 11, 2009.

(30) Foreign Application Priority Data

Sep. 18, 2008 (JP) .................................. 2008-238891

(51) Int. Cl.
*F25B 21/02* (2006.01)
*H01L 35/30* (2006.01)
*F25D 31/00* (2006.01)

(52) U.S. Cl.
CPC ............... *H01L 35/30* (2013.01); *F25B 21/02* (2013.01); *F25D 31/007* (2013.01); *F25D 2331/805* (2013.01); *F25D 2331/809* (2013.01)
USPC ............................ 62/3.2; 62/457.4; 62/381

(58) Field of Classification Search
CPC ............... F25D 31/002; F25D 31/007; F25D 2331/805; F25D 2331/803; F25B 2321/02; F25B 21/02
USPC .................. 62/3.2, 3.64, 457.4, 457.5, 238.2, 62/238.1, 335, 378, 381, 346, 345
See application file for complete search history.

(56) References Cited

U.S. PATENT DOCUMENTS 4,164,851 A * 8/1979 Bryant ............................ 62/381
4,825,665 A * 5/1989 Micallef ......................... 62/372

(Continued)

FOREIGN PATENT DOCUMENTS

JP 11-201613 A 7/1999
JP P2003-114080 A 4/2003

(Continued)

OTHER PUBLICATIONS

Office action received from the JPO, No. 2008-238891.

(Continued)

*Primary Examiner* — Mohammad M Ali
*Assistant Examiner* — Raheena Rehman
(74) *Attorney, Agent, or Firm* — Seed IP Law Group PLLC

(57) ABSTRACT

A packaged beverage temperature adjustment apparatus includes: a temperature adjustment section configured to hold a packaged beverage, and adjust a temperature of the packaged beverage; and a rotation driving section configured to rotate the temperature adjustment section, the temperature adjustment section including at least one temperature adjustment unit abutting on a side face of the packaged beverage.

10 Claims, 13 Drawing Sheets

(56) References Cited

U.S. PATENT DOCUMENTS

| | | | |
|---|---|---|---|
| 5,282,368 A * | 2/1994 | Ordoukhanian | 62/372 |
| 5,584,183 A * | 12/1996 | Wright et al. | 62/3.7 |
| 6,035,660 A * | 3/2000 | Craft | 62/457.9 |
| 6,474,093 B1 * | 11/2002 | Fink et al. | 62/434 |
| 6,606,866 B2 * | 8/2003 | Bell | 62/3.7 |
| 6,662,574 B2 * | 12/2003 | Loibl et al. | 62/64 |
| 6,701,718 B1 * | 3/2004 | Pisciotta | 62/3.3 |
| 6,945,069 B2 * | 9/2005 | Lee et al. | 62/378 |
| 7,059,137 B2 * | 6/2006 | Childress | 62/3.3 |
| 7,178,343 B2 * | 2/2007 | Linder | 62/3.6 |
| 7,650,757 B2 * | 1/2010 | Bhatti | 62/3.64 |
| 8,453,472 B2 * | 6/2013 | Pimputkar et al. | 62/126 |
| 8,459,497 B2 * | 6/2013 | Milan et al. | 221/150 R |
| 2008/0098767 A1 | 5/2008 | Molfese | |

FOREIGN PATENT DOCUMENTS

| | | |
|---|---|---|
| JP | P2005-331159 A | 12/2005 |
| WO | PCT/US00/25766 A2 | 3/2001 |
| WO | PCT/US2007/002553 A2 | 1/2007 |

OTHER PUBLICATIONS

English Translation of Japanese OA, No. 2008-238891.

First Office Action dated Sep. 7, 2012, in counterpart Chinese Patent Application 200980137061.X, 7 pages (Chinese).

First Office Action dated Sep. 7, 2012, in counterpart Chinese Patent Application 200980137061.X, 7 pages (English Translation).

European search report by European Patent Office.

* cited by examiner

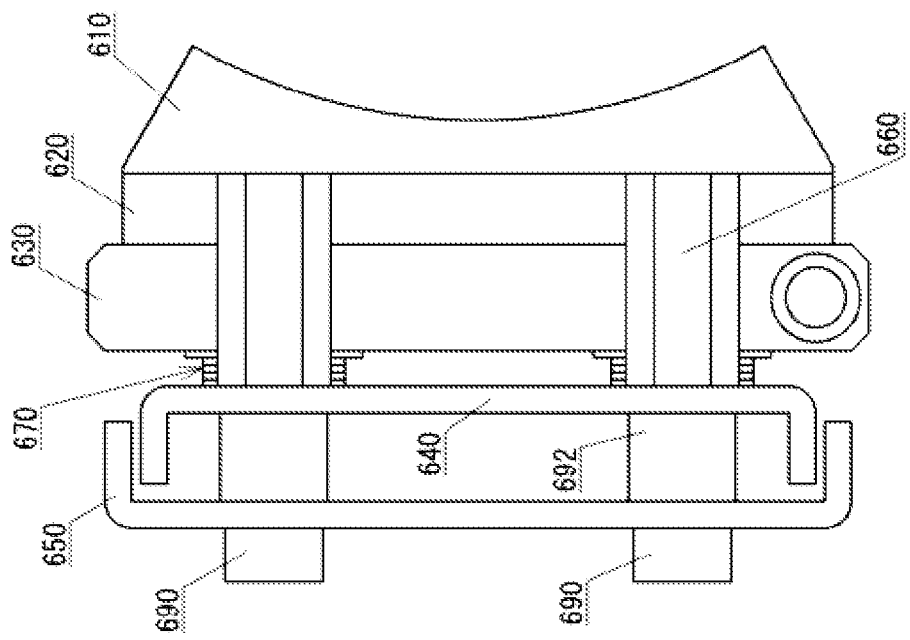
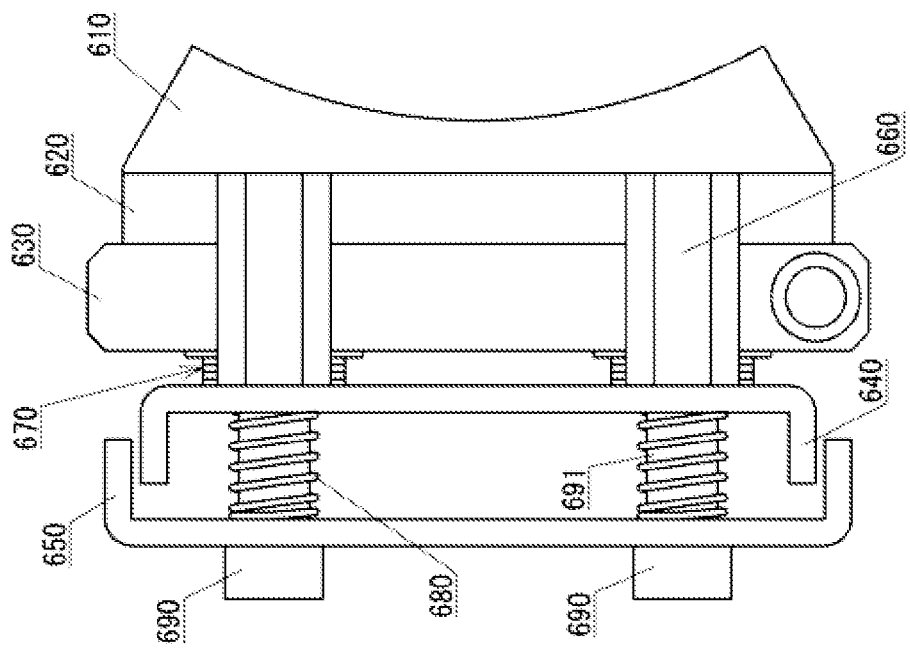

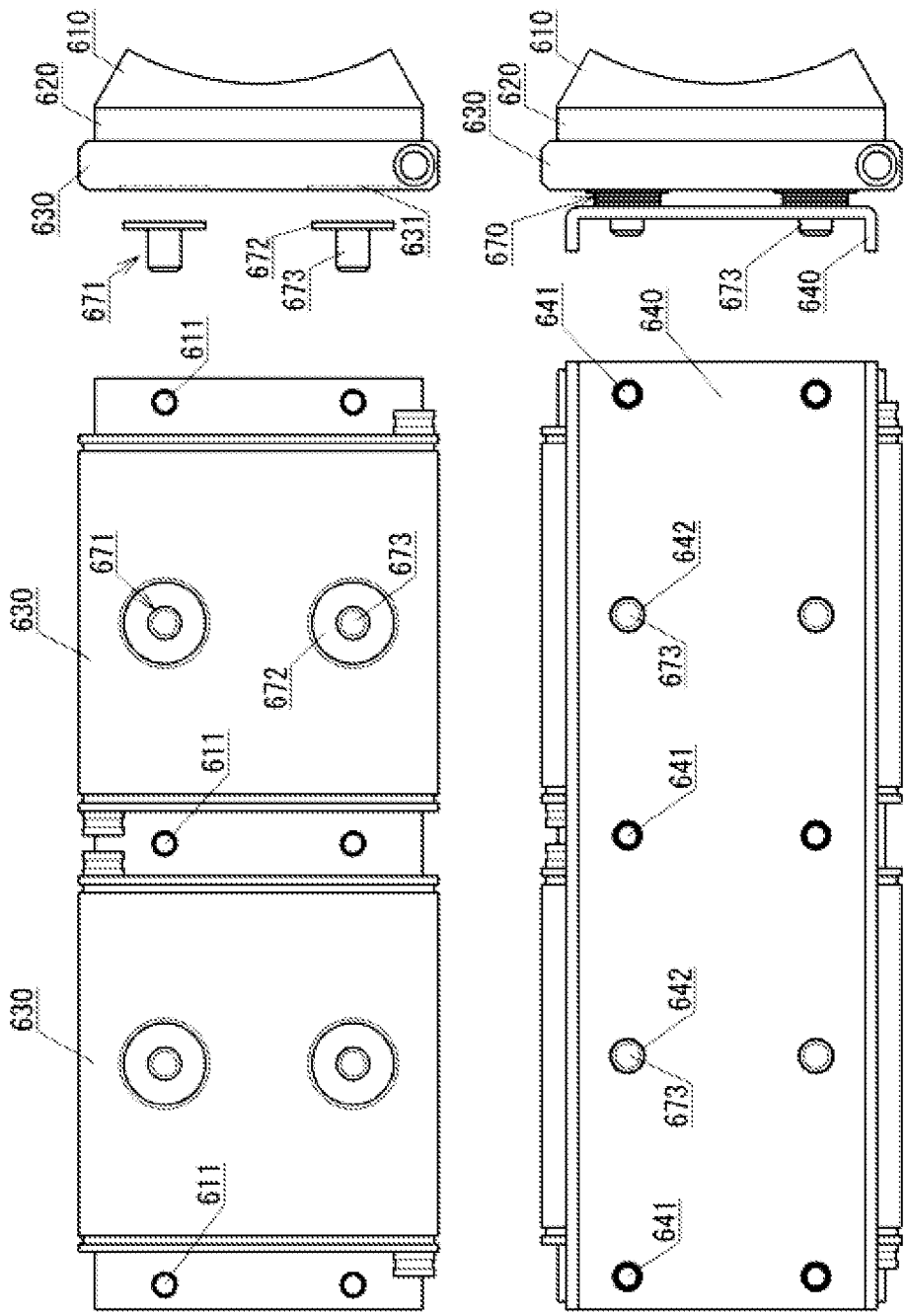

FIG. 13A
FIG. 13B
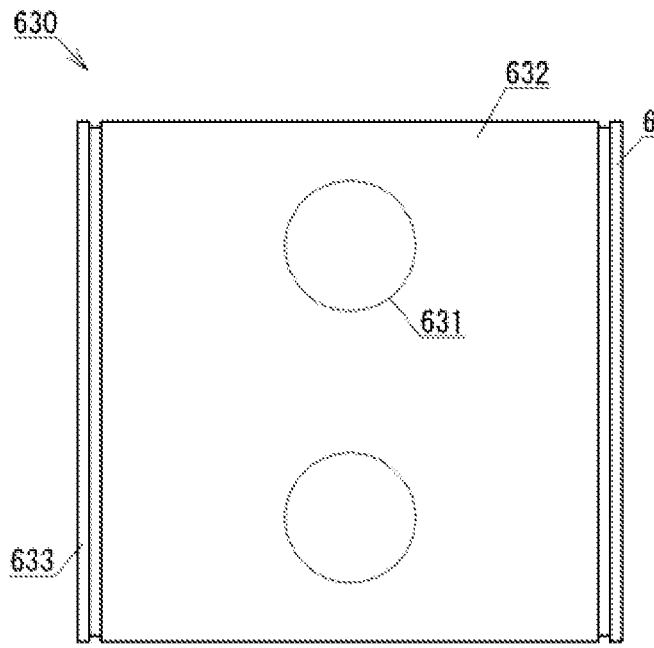
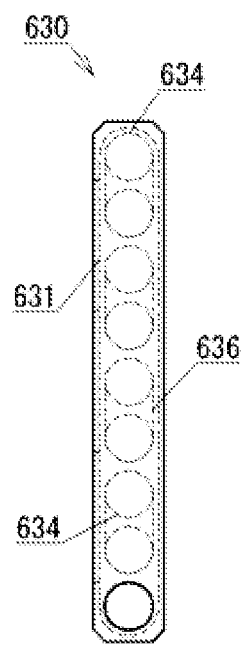
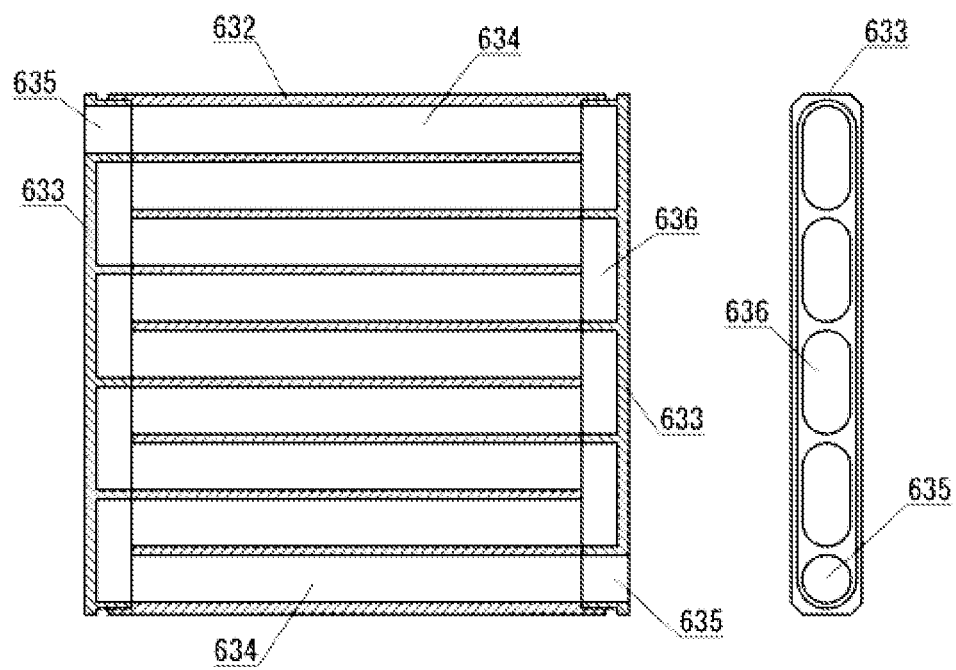
FIG. 13C
FIG. 13D

PACKAGED BEVERAGE TEMPERATURE ADJUSTMENT APPARATUS

CROSS REFERENCE TO RELATED APPLICATIONS

This is a continuation application of International Patent Application No. PCT/JP2009/065930 filed Sep. 11, 2009 claiming priority upon Japanese Patent Application No. 2008-238891 filed Sep. 18, 2008, of which full contents are incorporated herein by reference.

BACKGROUND OF THE INVENTION

1. Field of the Invention

The present invention relates to a packaged beverage temperature adjustment apparatus for adjusting (for example, decreasing) the temperature of a packaged beverage (for example, a canned beer or the like).

2. Description of the Related Art

Usually, a beverage in a packaged beverage such as a canned beer is cooled to an appropriate temperature for drinking (for example, about 5° C.) along with its package, and thereafter, the beverage inside the package is drunk. For example, the packaged beverage is cooled by being stored in a refrigerator for a predetermined time.

It takes a relatively long time, however, to cool the packaged beverage in the refrigerator. Therefore, in order that a user can drink the cooled beverage immediately when wishing to drink it, it is necessary that the packaged beverage be stored in the refrigerator to be cooled in advance.

In such a case, the packaged beverage stored in the refrigerator is not drunk soon, and it is continuously stored in the refrigerator, for example for several days. That is, the energy is consumed not only for cooling the packaged beverage from the room temperature (for example, 25° C.) to the appropriate temperature for drinking but also for maintaining the appropriate temperature for drinking. This is not necessarily preferable from the viewpoint of effective use of the energy.

If the packaged beverage can be cooled in a rapid manner, it is possible for a user to cool the packaged beverage immediately when wishing to drink the cooled beverage, and drink the cooled beverage on the scene. In such a case, it is not necessary that the packaged beverage be cooled in advance and maintained at the appropriate temperature for drinking, which allows the energy to be saved. Recently, from the ecological viewpoint, there has been an increasing need for such an apparatus as capable of saving the energy.

Japanese Patent Application Laid-Open No. 2003-114080 (¶¶0054 to 0057, FIG. 7) discloses a configuration in which a thermoelectric conversion element is mounted on a lower surface of a heat-absorbing-side heat conductor which is formed into a container-like shape, to cool a can and the like inserted in the heat-absorbing-side heat conductor.

An object of the present invention is to provide a packaged beverage temperature adjustment apparatus capable of rapidly adjusting the temperature of a packaged beverage.

SUMMARY OF THE INVENTION

A packaged beverage temperature adjustment apparatus according to the present invention comprises: a temperature adjustment section configured to hold a packaged beverage, and adjust a temperature of the packaged beverage; and a rotation driving section configured to rotate the temperature adjustment section, the temperature adjustment section including at least one temperature adjustment unit abutting on a side face of the packaged beverage.

In such a case as above, the temperature adjustment section may include the plurality of temperature adjustment units. Further in this case, the plurality of temperature adjustment units may be disposed around the packaged beverage, and a whole side face of the packaged beverage may be covered with the plurality of temperature adjustment units.

Further in the above cases, the plurality of temperature adjustment units may abut on a side face of the packaged beverage, whereby the temperature adjustment section may hold the packaged beverage.

Further in the above cases, the at least one temperature adjustment unit may include: a heat-transfer member abutting on a side face of the packaged beverage; and a thermoelectric conversion module having one surface thermally contacting the heat-transfer member.

In this case, the at least one temperature adjustment unit may further include a holder configured to hold the heat-transfer member movably in a back-and-forth manner, and may further include a biasing portion configured to bias the heat-transfer member in a direction of the packaged beverage. Furthermore, the at least one temperature adjustment unit may further include a liquid cooling member thermally contacting the other surface of the thermoelectric conversion module.

According to the present invention, the temperature of the packaged beverage can rapidly be adjusted.

BRIEF DESCRIPTION OF THE DRAWINGS

For more thorough understanding of the present invention and advantages thereof, the following description should be read in conjunction with the accompanying drawings, in which:

FIG. 6A is a view for explaining the structure of temperature adjustment units 111a to 111e.

FIG. 6B is a view for explaining the structure of a temperature adjustment unit 111f.

FIG. 10A is a view for explaining the positional relationship among constituents of a temperature adjustment unit 111 (part 3).

FIG. 10B is a view for explaining the positional relationship among constituents of a temperature adjustment unit 111 (part 4).

FIG. 13A is a front view for explaining the structure of a liquid cooling block 630.

FIG. 13B is a side view for explaining the structure of a liquid cooling block 630.

FIG. 13C is a cross-sectional view for explaining the structure of a liquid cooling block 630.

FIG. 13D is a bottom view of an end block 633.

DETAILED DESCRIPTION OF THE PREFERRED EMBODIMENTS

Hereinafter, an embodiment according to the present invention will be described in detail with reference to the drawings. There will be described below a packaged beverage temperature adjustment apparatus (hereinafter, referred to as a canned beer cooling apparatus) for cooling canned drink (more specifically, a canned beer) as a packaged beverage. The present canned beer cooling apparatus is used to rapidly cool a canned beer that is not cooled, at such a time as when a user suddenly wishes to drink the canned beer. More specifically, the present canned beer cooling apparatus is configured to cool a 350-ml canned beer from the room temperature (25° C.) to about 5° C. spending about 5 minutes.

Figure 1:
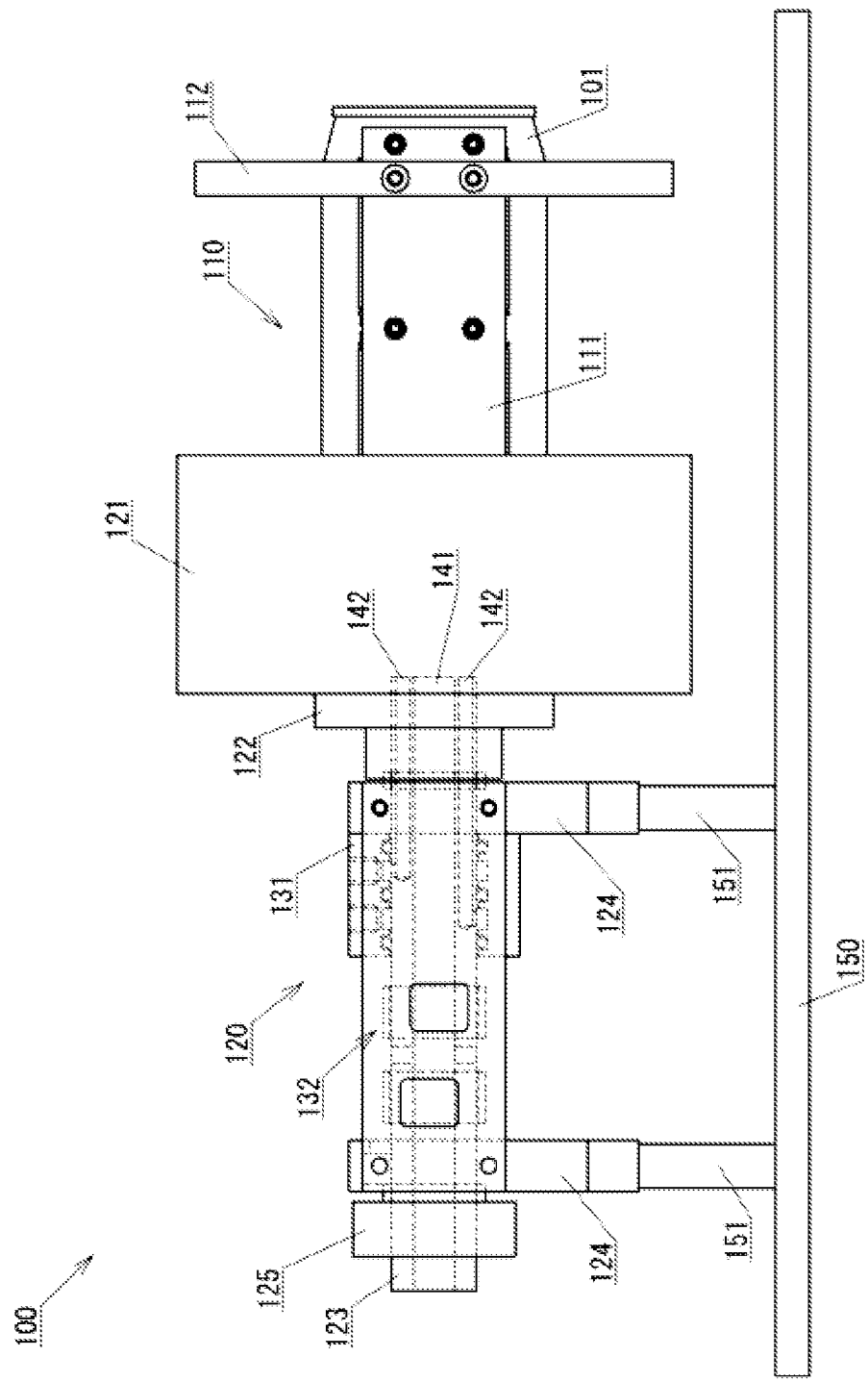
FIG. 1 is a front view for explaining the entire structure of a canned beer cooling apparatus of an embodiment according to the present invention.
Figure 2:
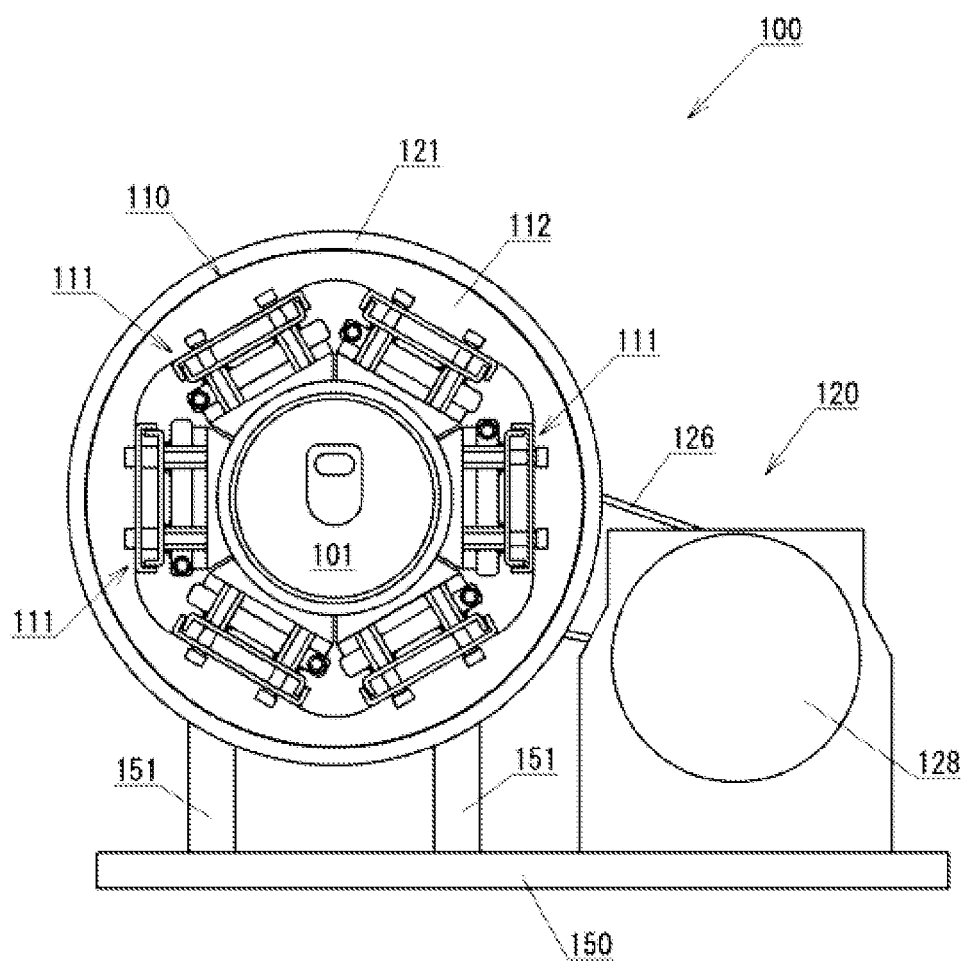
FIG. 2 is a side view for explaining the entire structure of a canned beer cooling apparatus of an embodiment according to the present invention.
Figure 3:
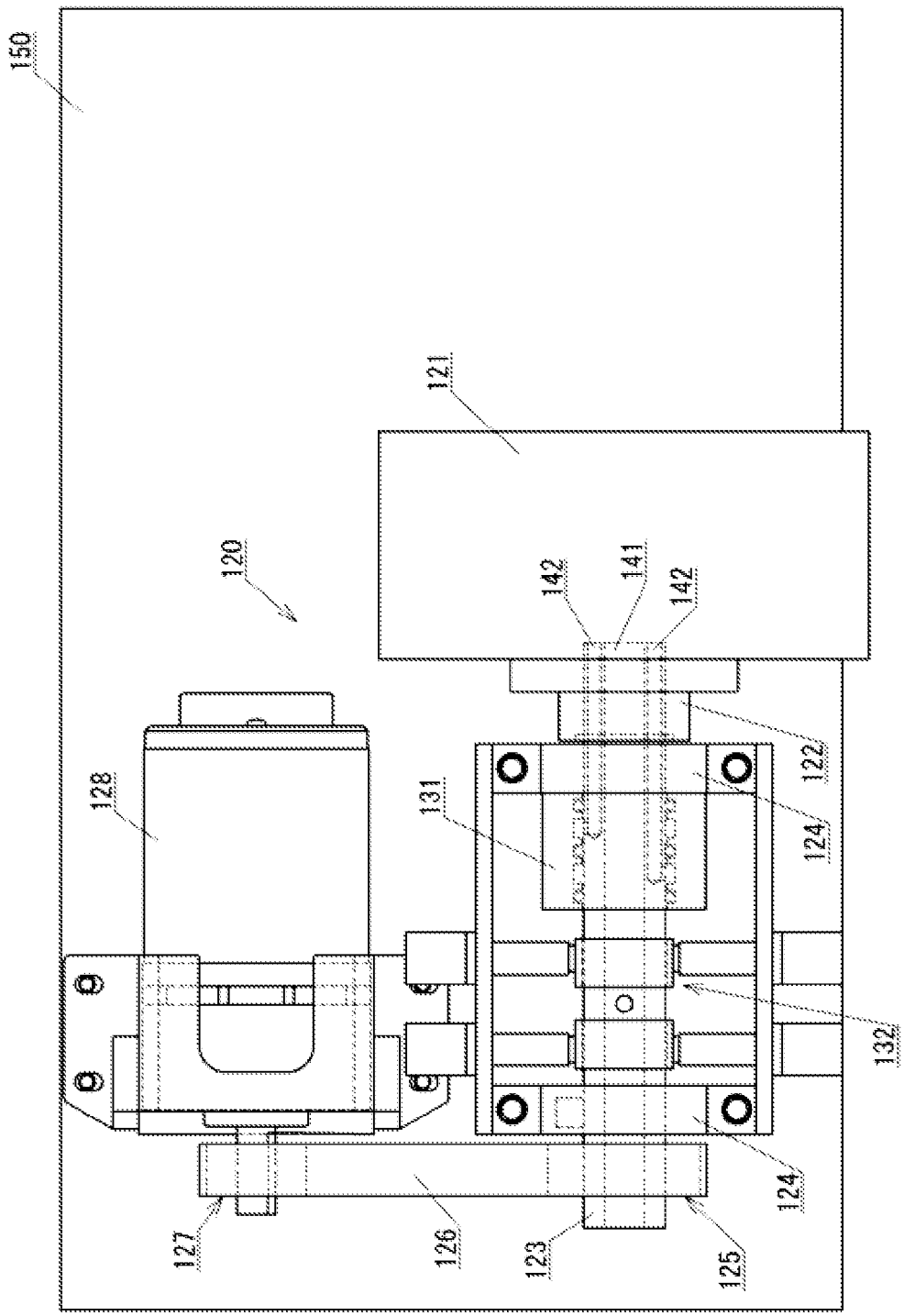
FIG. 3 is a plan view for explaining the entire structure of a canned beer cooling apparatus of an embodiment according to the present invention.

FIGS. 1 to 3 are views for explaining the entire structure of a canned beer cooling apparatus of an embodiment according to the present invention. FIG. 1 shows a front view, FIG. 2 shows a side view, and FIG. 3 shows a plan view.

As shown in FIGS. 1 and 2, a canned beer cooling apparatus 100 of an embodiment according to the present invention includes a temperature adjustment section 110 and a rotation driving section 120. It is to be noted that, in FIG. 3, the temperature adjustment section 110 is not shown for the sake of convenience.

The temperature adjustment section 110 holds a canned beer 101 and adjusts the temperature of (in this embodiment, cools) the canned beer 101. As shown in FIGS. 1 and 2, the temperature adjustment section 110 includes a temperature adjustment unit 111 and a temperature adjustment unit holding section 112.

The temperature adjustment unit 111 abuts on the side face of the canned beer 101 to adjust the temperature of (in this embodiment, cool) the canned beer 101. As shown in FIG. 2, the temperature adjustment section 110 includes a plurality of (in this embodiment, six) temperature adjustment units 111. It is to be noted that, for the sake of convenience, FIG. 1 shows only one temperature adjustment unit 111. As described below, each temperature adjustment unit 111 includes a thermoelectric conversion module (Peltier module), and cools the canned beer 101 by feeding an electric current in a predetermined direction through the thermoelectric conversion module.

The temperature adjustment unit holding section 112 holds a plurality of the temperature adjustment units 111 such that the temperature adjustment units 111 are disposed around the canned beer 101. As described below, the temperature adjustment section 110 includes a plurality of (in this embodiment, two) temperature adjustment unit holding sections 112; however, in FIG. 1, only one piece can be seen out of two pieces.

The detailed structure of the temperature adjustment section 110 will be described below.

The rotation driving section 120 rotates the temperature adjustment section 110, thereby rotating the canned beer 101 held by the temperature adjustment section 110 along with the temperature adjustment section 110. As shown in FIGS. 1 to 3, the rotation driving section 120 includes a temperature adjustment section holding section 121, a coupling member 122, a rotating shaft 123, a bearing section 124, a driven pulley 125, a belt 126, a driving pulley 127, and a reducer-equipped motor 128. The rotating shaft 123 is mounted with a rotary joint 131 and a slip ring 132 in the vicinity of a central portion thereof.

The temperature adjustment section holding section 121 is a member: configured to hold the temperature adjustment section 110; having a shape of low-profile hollow cylinder with a bottom; and coupled to the temperature adjustment section 110 (the temperature adjustment unit holding section 112) in the state where one of the temperature adjustment unit holding sections 112 of the temperature adjustment section 110 is put into an opening of the member. Furthermore, the temperature adjustment section holding section 121 has a hole, into which one end of the rotating shaft 123 is inserted, formed at the center of the bottom portion of the temperature adjustment section holding section 121.

The coupling member 122 is a member configured to couple the temperature adjustment section holding section 121 and the rotating shaft 123. The temperature adjustment section holding section 121 and the rotating shaft 123 are coupled by the coupling member 122, thereby being rotated as one piece.

The rotating shaft 123 is a shaft member for rotating the temperature adjustment section holding section 121, which shaft member comprises a hollow shaft having a through-hole 141 formed so as to extend in a longitudinal direction. The through-hole 141 allows wiring to pass therethrough, which wiring is used for supplying an electric power to the thermoelectric conversion module in the temperature adjustment unit 111. That is, the wiring connecting the thermoelectric conversion module and the slip ring 132 is allowed to pass through the through-hole 141. Furthermore, a plurality of (in this embodiment, twelve) small longitudinal holes 142 having their respective predetermined depths are formed around the through-hole 141 on one (right-sided one in FIG. 1) of the end faces of the rotating shaft 123. Transverse holes communicating respectively with the longitudinal holes 142 are formed on the side face of the rotating shaft 123 in the vicinity of the area on which the rotary joint 131 is to be mounted. A coolant (cooling medium) is supplied to and recovered from the temperature adjustment units 111 through the transverse holes, the longitudinal holes 142, and the rotary joint 131.

The bearing section 124 is a member configured to support the rotating shaft 123 in a rotatable manner, and includes a ball bearing and a bearing holder configured to hold the ball bearing. As shown in FIG. 1, the rotation driving section 120 includes two bearing sections 124 disposed respectively near both end portions of the rotating shaft 123. Each bearing section 124 is fixed to a base section 150 by being mounted on a pair of leg sections 151 vertically provided on the base section 150.

The driven pulley 125 is a member for rotating the rotating shaft 123, and is mounted on (fixed to) the rotating shaft 123 in the vicinity of one of the end portions of the rotating shaft 123. The driving pulley 127 is a member mounted on (fixed to) a rotating shaft (output shaft) of the reducer-equipped motor 128, and is rotated together with the rotating shaft of the reducer-equipped motor 128 as one piece. The belt 126 is wound around the driven pulley 125 and the driving pulley 127 to transmit the rotation of the driving pulley 127 to the driven pulley 125. That is, the torque of the reducer-equipped motor 128 is transmitted to the rotating shaft 123 through the driving pulley 127, the belt 126, and the driven pulley 125. The reducer-equipped motor 128 rotates the rotating shaft 123 through the driving pulley 127, the belt 126, and the driven pulley 125. It is to be noted that, in FIG. 1, the belt 126, the driving pulley 127, and the reducer-equipped motor 128 are omitted for the sake of convenience.

The rotary joint 131 supplies a coolant for heat dissipation to the temperature adjustment section 110 and recovers the coolant used in the temperature adjustment section 110 from the temperature adjustment section 110. By using the rotary joint 131, the coolant can be supplied to the temperature adjustment section 110 from the outside, or the like, even while rotating the temperature adjustment section 110. As described above, the rotary joint 131 supplies the coolant to and recovers the coolant from each temperature adjustment unit 111 through the transverse holes and longitudinal holes 142 formed on the rotating shaft 123. That is to say, each temperature adjustment unit 111 and the longitudinal hole 142 formed on one of the end faces of the rotating shaft 123 are appropriately connected, for example, through a tube and a joint, which are not shown in the figures for the sake of convenience, so that the coolant can be supplied to and recovered from each temperature adjustment unit 111. As described above, in this embodiment, twelve longitudinal holes 142 are formed, and used respectively as holes for supplying the coolant to and as holes for recovering the coolant from six temperature adjustment units 111 (6×2=12).

The slip ring 132 supplies an electric power to the temperature adjustment section 110. By using the slip ring 132, the electric power can be supplied from the outside to the temperature adjustment section 110, even while rotating the temperature adjustment section 110. As described above, the wiring between the slip ring 132 and each temperature adjustment unit 111 (thermoelectric conversion module) is carried out through the hollow of the through-hole 141 in the rotating shaft 123.

Next, the structure of the temperature adjustment section 110 will be described below.

Figure 4:
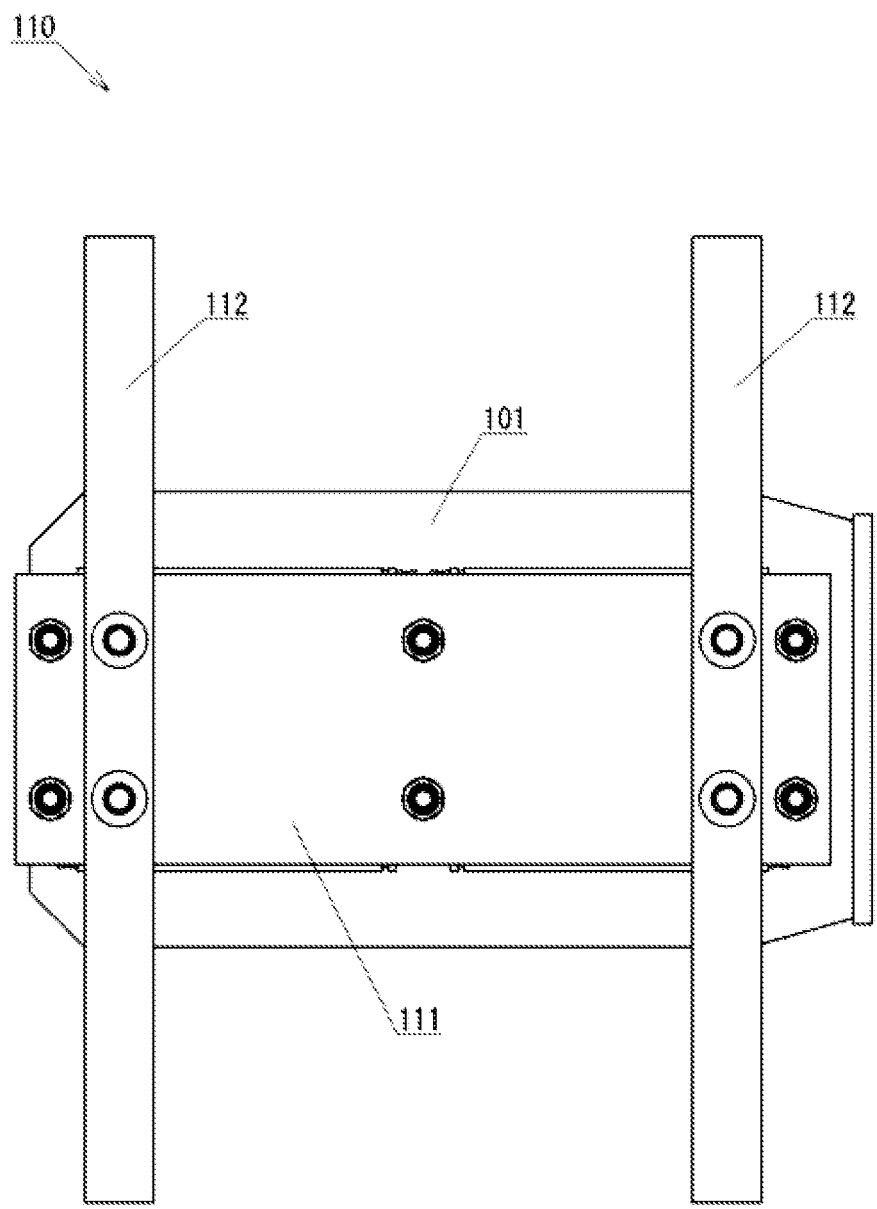
FIG. 4 is a front view for explaining the structure of a temperature adjustment section 110.
Figure 5:
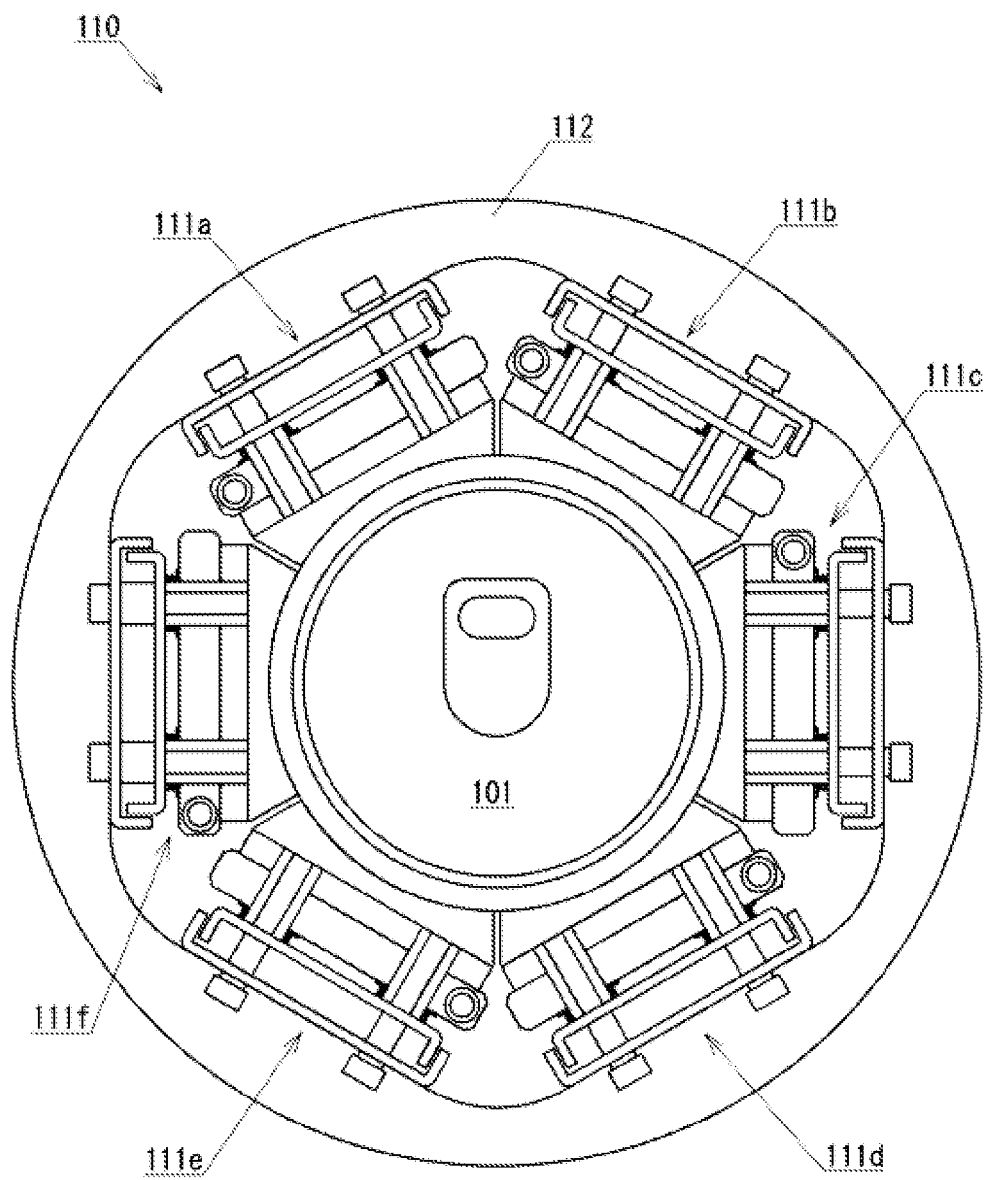
FIG. 5 is a side view for explaining the structure of a temperature adjustment section 110.

FIGS. 4 and 5 are views for explaining the structure of the temperature adjustment section 110. FIG. 4 shows a front view, and FIG. 5 shows a side view. For the sake of convenience, FIG. 4 also shows only one temperature adjustment unit 111.

As described above, the temperature adjustment section 110 includes the temperature adjustment unit 111 and the temperature adjustment unit holding section 112. As shown in FIG. 5, the temperature adjustment section 110 includes a plurality of (more specifically, six) temperature adjustment units 111a to 111f, and all the temperature adjustment units 111a to 111f together cover substantially a whole area of the side face of the canned beer 101. The temperature adjustment unit holding section 112 holds a plurality of the temperature adjustment units 111 such that a plurality of the temperature adjustment units 111 are disposed in such positions as above. As shown in FIG. 4, the temperature adjustment section 110 includes a plurality of (more specifically, two) temperature adjustment unit holding sections 112, each of which is disposed near the end portion (upper end portion or lower end portion) of the canned beer 101 when the canned beer 101 is set. As shown in FIG. 5, the temperature adjustment unit holding section 112 is a ring-like shaped member obtained by forming a regular hexagonal hole on the center of a disc-shaped member, and the temperature adjustment unit 111 is fixed to an inner circumferential surface (each side of the regular hexagon) of the hole.

Next, the structure of the temperature adjustment unit 111 will be described below. A plurality of the temperature adjustment units 111a to 111f have basically the same structure. However, among a plurality of the temperature adjustment units 111a to 111f, there is a difference in that: five temperature adjustment units 111a to 111e (hereinafter, sometimes referred to as a movable temperature adjustment unit) are configured to be movable in a back-and-forth manner (forward and backward motion) with respect to the temperature adjustment unit holding section 112; while, one temperature adjustment unit 111f (hereinafter, sometimes referred to as a fixed temperature adjustment unit) is configured not to be movable in a back-and-forth manner (forward and backward motion).

FIGS. 6A and 6B are views for explaining the structure of the temperature adjustment unit 111. FIG. 6A shows the structures of the movable temperature adjustment units 111a to 111e, and FIG. 6B shows the structure of the fixed temperature adjustment unit 111f.

As shown in FIGS. 6A and 6B, the temperature adjustment unit 111 includes a heat-transfer block 610, a thermoelectric conversion module 620, a liquid cooling block 630, a pusher 640, and a holder 650.

The heat-transfer block 610 is a heat-transfer member thermally contacting one of surfaces (in this embodiment, heat absorbing surface) of the thermoelectric conversion module 620 while abutting on the side face of the canned beer to transfer heat therebetween. For example, the heat-transfer block 610 is made of metal having high heat conductivity (for example, aluminum). In the heat-transfer block 610, the surface on which the side face of the canned beer abuts is formed into a shape suitable for the side face of the canned beer so as to come into good contact with the side face of the canned beer. In this embodiment, since substantially a whole area of the side face of the canned beer is supposed to be covered with six heat-transfer blocks 610, each heat-transfer block 610 is so configured as to cover one-sixth of the area in a circumferential direction of the canned beer. The heat-transfer block 610 and the thermoelectric conversion module 620 are bonded together to form one piece, for example, by an adhesive having high heat conductivity.

The thermoelectric conversion module 620 is temperature adjustment means (cooling means) for adjusting the temperature of (in this embodiment, cooling) the heat-transfer block 610 in order to adjust the temperature of (in this embodiment, cool) the canned beer, and the thermoelectric conversion module 620 is sandwiched between the heat-transfer block 610 and the liquid cooling block 630. The structure of the thermoelectric conversion module 620 will be described below.

The liquid cooling block 630 is a heat-transfer member (heat dissipation member) contacting the other surface (in this embodiment, heat radiating surface) of the thermoelectric conversion module 620 to transfer (dissipate) the heat. For example, the liquid cooling block 630 is made of metal having high heat conductivity (for example, aluminum). The liquid cooling block 630 has substantially a low-profile rectangular-prism-like shape, and has a liquid passage through which the coolant passes formed therein. The liquid passage is formed to extend in a serpentine manner in parallel with the heat radiating surface of the thermoelectric conversion module 620 so that the coolant supplied from one joint as a supply port is allowed to pass in a serpentine manner toward the other joint as a discharge port, thereby efficiently drawing heat from the heat radiating surface of the thermoelectric conversion module 620. The structure of the liquid cooling block 630 will be described below.

The pusher 640 is so formed as to have a U-like shaped cross-section by bending both end portions in a lateral direction of a narrow flat-plate-like member at a right angle. The pusher 640 is joined (screwed) to the heat-transfer block 610 to form one piece via a stud 660, which is a hexagonal-prism-like member having a screw hole formed on the central portion.

The holder 650 is a member for holding the pusher 640, and is so formed as to have a U-like shaped cross-section by bending both end portions in a lateral direction of a narrow flat-plate-like member at a right angle in a manner similar to that for the pusher 640. The holder 650 is attached to the temperature adjustment unit holding section 112 in the state where the opening side of a U-like shape of the holder 650 is oriented toward the pusher 640.

As shown in FIGS. 6A and 6B, springs (more specifically, disc springs) 670 are disposed as a biasing means between the liquid cooling block 630 and the pusher 640, and the liquid cooling block 630 is pressed against the thermoelectric conversion module 620 by a biasing force of the disc springs 670. In order to enhance the heat conductivity, for example, thermal grease, which is a semisolid material with high heat conductivity, is applied to a contacting surface of the liquid cooling block 630 and the thermoelectric conversion module 620.

The above-described structure is common to all the six temperature adjustment units 111. The differences between the movable temperature adjustment units 111a to 111e and the fixed temperature adjustment unit 111f will be described below.

As shown in FIG. 6A, in the movable temperature adjustment units 111a to 111e, springs (more specifically, compression coil springs) 680 are disposed as a biasing means between the pusher 640 and the holder 650, and the pusher 640 and the holder 650 are biased by the compression coil springs 680 in such a direction that the pusher 640 and the holder 650 move away from each other. The compression coil spring 680 is mounted on an outer circumference of a collar for moving 691, which is a cylindrical member into which a shaft portion (screw portion) of a screw 690 is inserted.

On the other hand, As shown in FIG. 6B, in the fixed temperature adjustment unit 111f, collars for fixing 692 are disposed between the pusher 640 and the holder 650, and the pusher 640 and the holder 650 are fixed by the screws 690 via the collars for fixing 692.

Figure 7A:
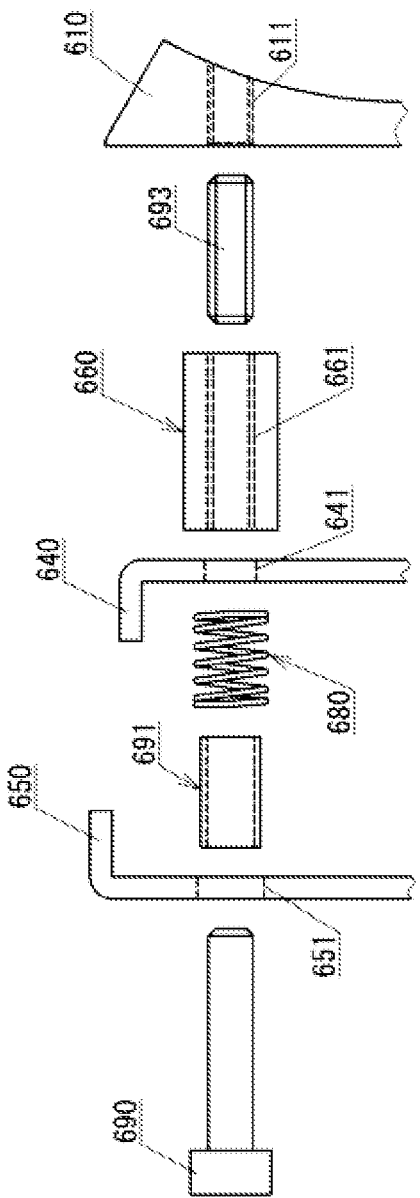
FIG. 7A is a view for explaining the coupling relationship among constituents of temperature adjustment units 111a to 111e.
Figure 7B:
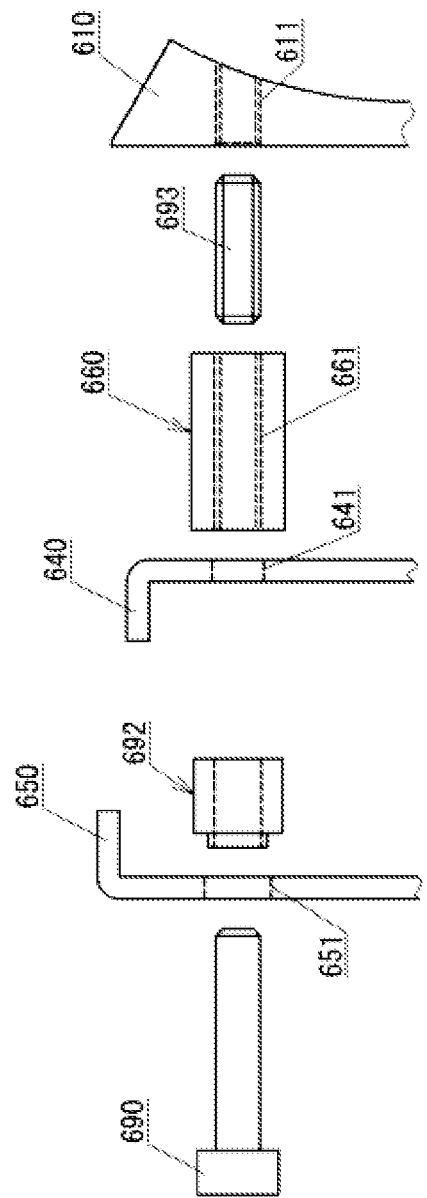
FIG. 7B is a view for explaining the coupling relationship among constituents of a temperature adjustment unit 111f.

FIGS. 7A and 7B are views for explaining a coupling relationship among constituents of the temperature adjustment unit 111. FIG. 7A illustrates the coupling relationship in the movable temperature adjustment units 111a to 111e, and FIG. 7B illustrates the coupling relationship in the fixed temperature adjustment unit 111f.

As shown in FIG. 7A, in the movable temperature adjustment units 111a to 111e, initially, the heat-transfer block 610 and the stud 660 are coupled by a screw 693. Furthermore, the pusher 640 and the stud 660 are coupled by screwing the screw 690 with its shaft portion inserted through the collar for moving 691, into a screw hole 661 formed through the stud 660 via a hole 651 formed on the holder 650 and a hole 641 formed on the pusher 640. As a result, the heat-transfer block 610, the stud 660, the pusher 640, the collar 691, and the screw 690 are coupled to form one piece. As described above, the compression coil spring 680 is mounted on the outer circumference of the collar for moving 691 to bias the pusher 640 and the holder 650 in such a direction that the pusher 640 and the holder 650 move away from each other. As shown in FIG. 7A, a diameter of the collar for moving 691 is larger than a diameter of the hole 641 formed on the pusher 640 but smaller than a diameter of the hole 651 formed on the holder 650. Therefore, when an external force is applied to the heat-transfer block 610 from the right side toward the left side in FIG. 7A while the holder 650 is fixed, for example, the left-sided end portion of the collar for moving 691 integrated with the heat-transfer block 610 is projected toward the left side after being allowed to pass through the hole 651 formed on the holder 650.

On the other hand, As shown in FIG. 7B, in the fixed temperature adjustment unit 111f, in a manner similar to that for the movable temperature adjustment units 111a to 111e, initially, the heat-transfer block 610 and the stud 660 are coupled by the screw 693. Furthermore, in the fixed temperature adjustment unit 111f, the holder 650, the pusher 640, and the stud 660 are coupled by screwing the screw 690 into the screw hole 661 formed through the stud 660 via the hole 651 formed on the holder 650, the collar for fixing 692, and the hole 641 formed on the pusher 640. As shown in FIG. 7B, the collar for fixing 692 has such a shape as obtained by coupling a large-diameter solid-cylindrical member and a small-diameter solid-cylindrical member and forming through the center of the coupled members a hole through which the shaft portion of the screw 690 is allowed to pass, wherein the diameter of the small-diameter portion is set so as to allow the small-diameter portion to pass through the hole 651 formed on the holder 650, and the diameter of the large-diameter portion is set so as not to allow the large-diameter portion to pass through the hole 641 formed on the pusher 640 or the hole 651 formed on the holder 650. As a result, the heat-transfer block 610, the stud 660, the pusher 640, the collar for fixing 692, the holder 650, and the screw 690 are coupled to form one piece.

Figure 8B:
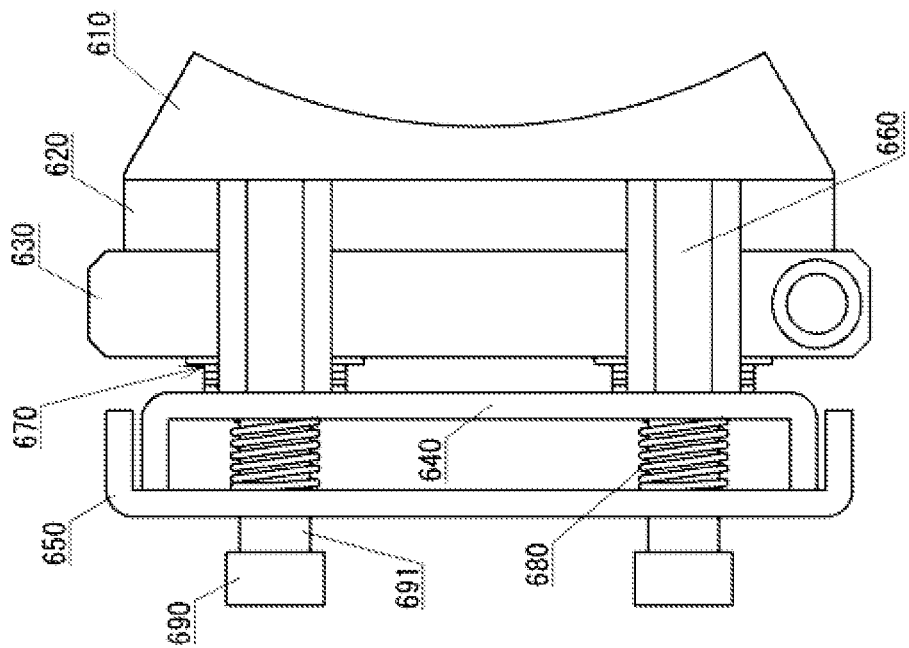
FIG. 8B is a view for explaining the back-and-forth movement of movable temperature adjustment units 111a to 111e (part 2).
Figure 8A:
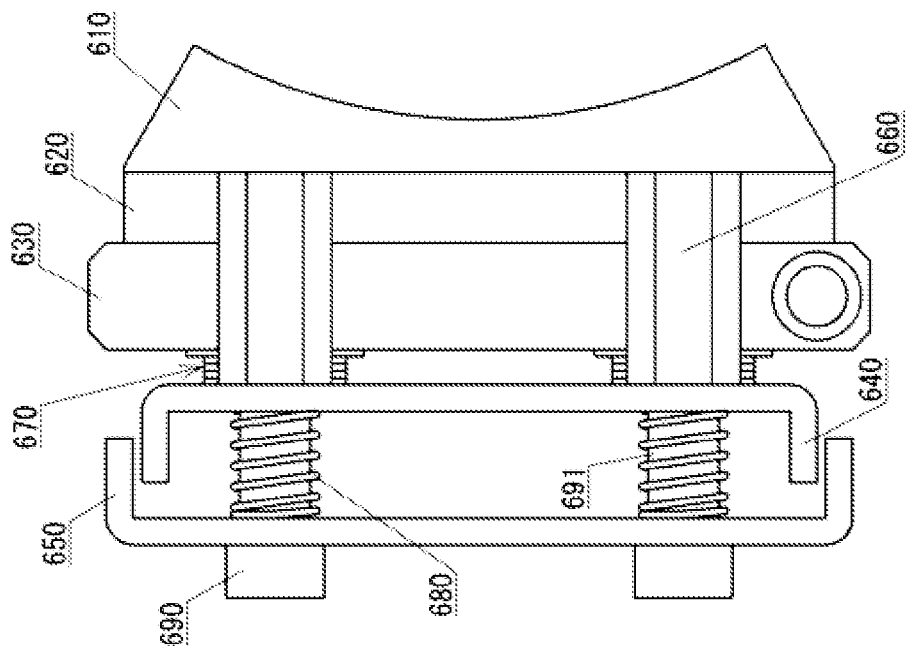
FIG. 8A is a view for explaining the back-and-forth movement of movable temperature adjustment units 111a to 111e (part 1).

FIGS. 8A and 8B are views for explaining the back-and-forth movement of the movable temperature adjustment units 111a to 111e.

In the movable temperature adjustment units 111a to 111e, when the external force is not applied to the heat-transfer block 610, by the biasing force of the compression coil springs 680, the pusher 640 is pressed in such a direction that the pusher 640 goes away from the holder 650 (rightward direction in FIGS. 8A and 8B), and heads of the screws 690 integrated with the pusher 640 (via the collars for moving 691) remain at rest in the state where the heads abut on the holder 650 as shown in FIG. 8A.

On the other hand, in the state shown in FIG. 8A, when the external force is applied to the heat-transfer block 610 from the right side toward the left side in FIG. 8A, the pusher 640 is pressed via the studs 660 against the biasing force of the compression coil springs 680 in such a direction that the pusher 640 comes close to the holder 650 (leftward direction in FIGS. 8A and 8B), and the end portions of the pusher 640 bent at a right angle remain at rest in the state where the end portions abut on the holder 650 as shown in FIG. 8B. At this point, as shown in FIG. 8B, the collars for moving 691 and the screws 690 both integrated with the pusher 640 are projected toward the left side compared with the state shown in FIG. 8A.

As described above, in the movable temperature adjustment units 111a to 111e, the heat-transfer block 610 (and the thermoelectric conversion module 620, the liquid cooling block 630, and the pusher 640, all of which are integrated with the heat-transfer block 610) is configured to be movable in a back-and-forth manner (forward and backward motion) with respect to the holder 650.

FIGS. 9A, 9B, 10A, 10B, 11A and 11B are views for explaining the positional relationship among constituents of the temperature adjustment unit 111.

Figure 9A:
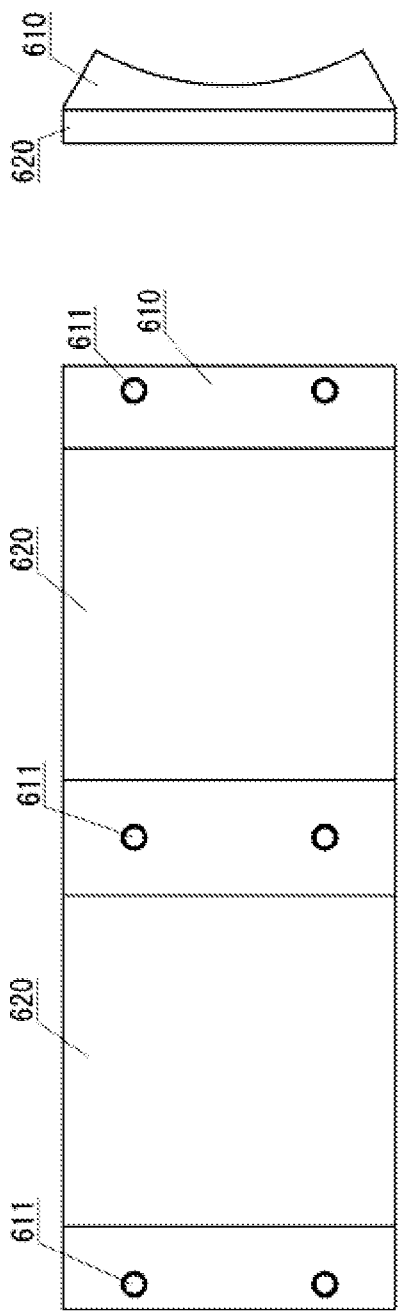
FIG. 9A is a view for explaining the positional relationship among constituents of a temperature adjustment unit 111 (part 1).

As shown in FIG. 9A, in this embodiment, the two thermoelectric conversion modules 620 are provided with respect to one heat-transfer block 610, and the two thermoelectric conversion modules 620 are disposed between: both ends in a longitudinal direction of the heat-transfer block 610; and the screw holes 611 formed on the center of the heat-transfer block 610. As described above, the heat-transfer block 610 and the thermoelectric conversion modules 620 are bonded, for example, by an adhesive having high heat conductivity to form one piece. The two thermoelectric conversion modules 620 are electrically connected in series.

Figure 9B:
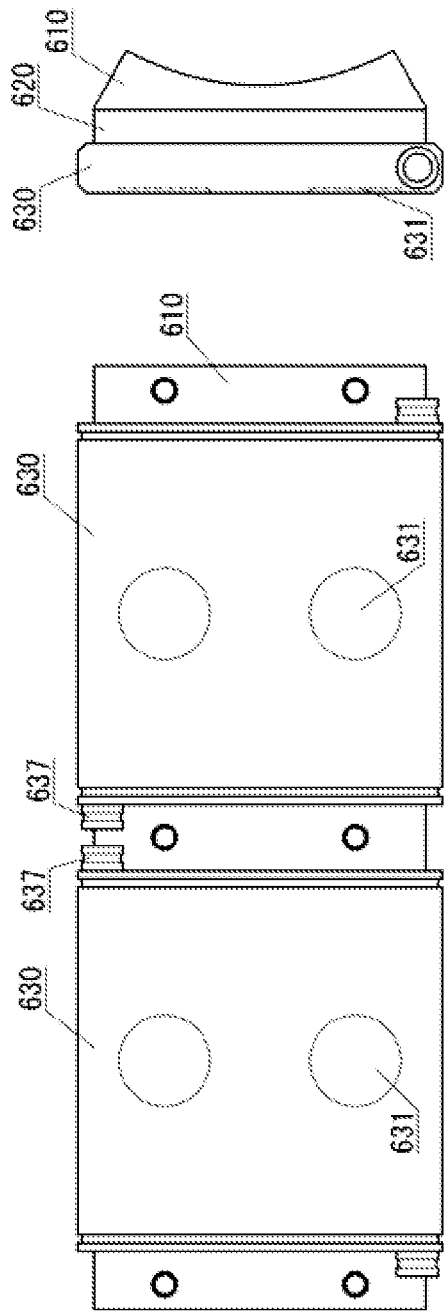
FIG. 9B is a view for explaining the positional relationship among constituents of a temperature adjustment unit 111 (part 2).

As shown in FIG. 9B, the liquid cooling block 630 is prepared for each thermoelectric conversion module 620, and as described above, the thermoelectric conversion module 620 and the liquid cooling block 630 thermally contact each other, for example, through the thermal grease in order to enhance the heat conductivity. The two liquid cooling blocks 630 are coupled in series via the joint 637 and the tube (not shown) so as to form one channel. As shown in FIG. 9B, shallow holes 631, into which disc spring holders 671 described below are to be fitted, are formed on one surface opposite to the other surface of the liquid cooling block 630, wherein the other surface contacts the thermoelectric conversion module 620.

Furthermore, As shown in FIG. 10A, the two disc spring holders 671 are prepared for each liquid cooling block 630. The disc spring holder 671 has such a shape as obtained by coupling a solid-cylindrical member (cylindrical section) 673 to the center of a disc-shaped member (disc section) 672. The disc section 672 is fit in the hole 631 formed on the liquid cooling block 630, and a disc spring is mounted on the cylindrical section 673, and the liquid cooling block 630 is pressed against the thermoelectric conversion module 620 by the biasing force of the disc spring.

Furthermore, As shown in FIG. 10B, the pusher 640 is disposed such that the cylindrical section 673 of each disc spring holder 671 is inserted into a hole 642 formed on the pusher 640 while the disc spring 670 is mounted on the cylindrical section 673 of each disc spring holder 671. That is, each disc spring holder 671 presses the disc section 672 against the liquid cooling block 630 by the biasing force of the disc spring 670, while the cylindrical section 673 is held in the hole 642 formed on the pusher 640. At this point, the screw holes 611 formed on the heat-transfer block 610 are aligned in position with the holes 641 formed on the pusher 640.

Figures 11A, 11B:
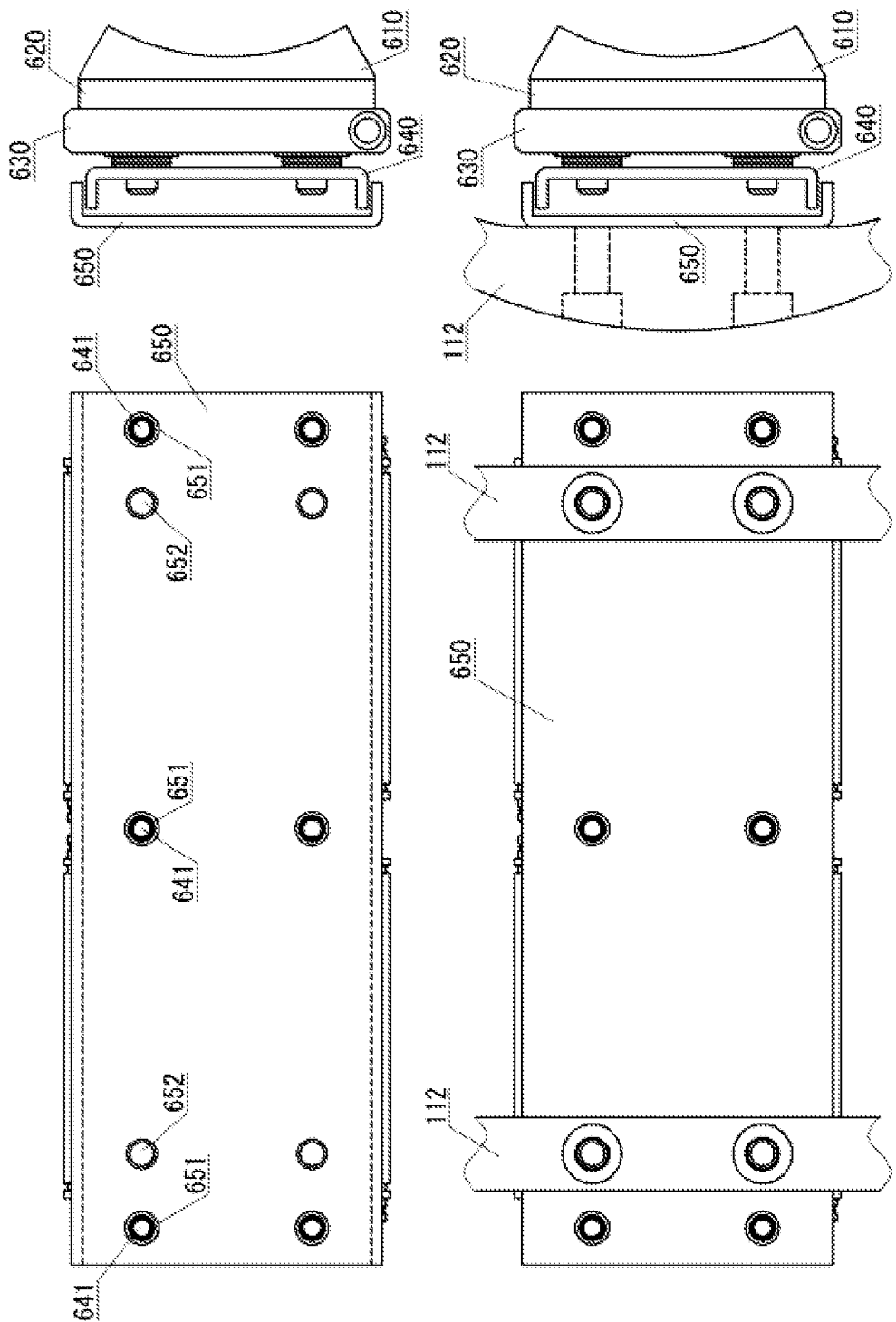
FIG. 11A is a view for explaining the positional relationship among constituents of a temperature adjustment unit 111 (part 5).
FIG. 11B is a view for explaining the positional relationship among constituents of a temperature adjustment unit 111 (part 6).

Furthermore, As shown in FIG. 11A, the holder 650 is so disposed as to cover the pusher 640. At this point, the holes 641 formed on the pusher 640 are aligned in position with the holes 651 formed on the holder 650. As shown in FIG. 11A, the holder 650 has also screw holes 652 formed thereon for fixing the holder 650 to the temperature adjustment unit holding sections 112. That is, As shown in FIG. 11B, the temperature adjustment unit 111 as a whole is held by the temperature adjustment unit holding section 112s by fixing the holder 650 to the temperature adjustment unit holding sections 112 via the screw holes 652.

Next, the structure of the thermoelectric conversion module 620 will be described below.

Figure 12:
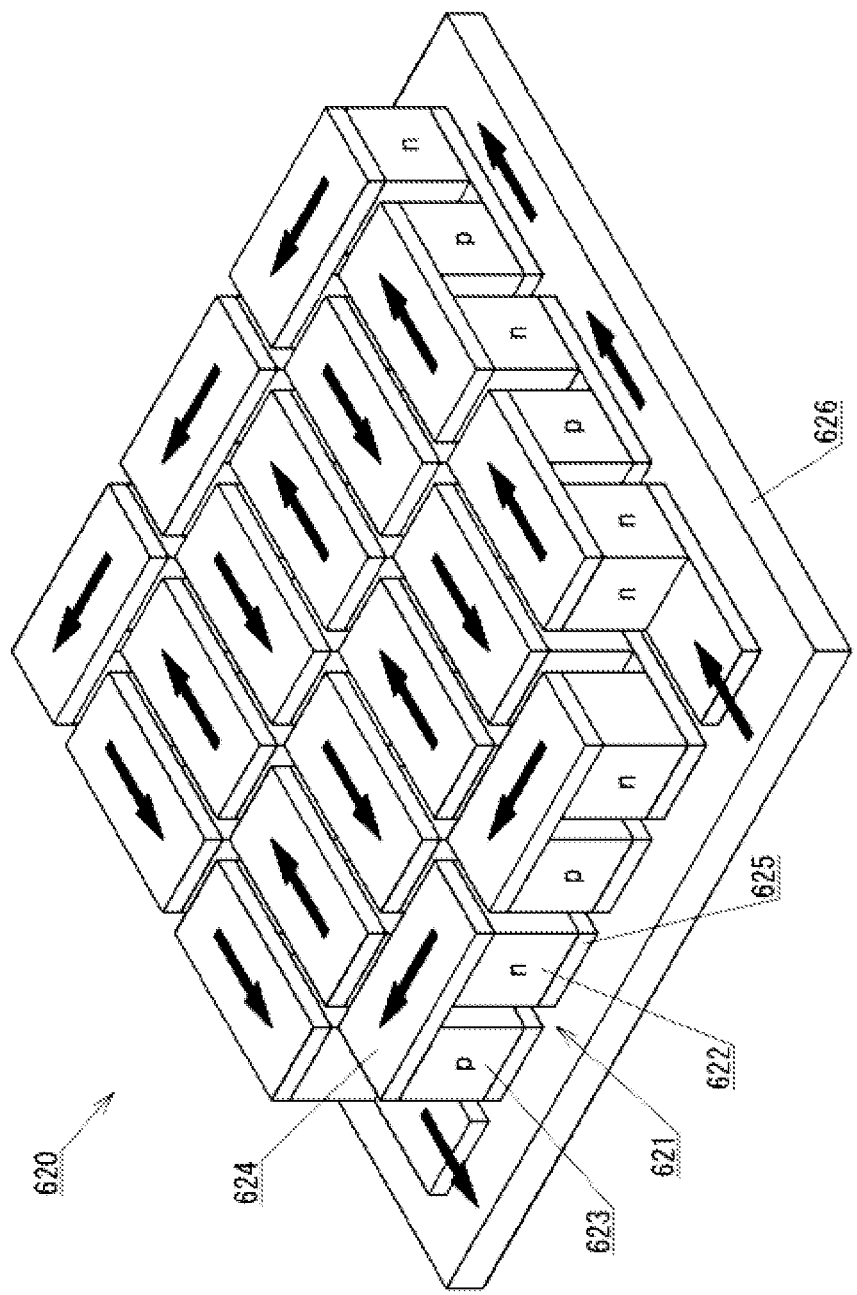
FIG. 12 is a view for explaining the structure of a thermoelectric conversion module 620.

FIG. 12 is a view for explaining the structure of the thermoelectric conversion module 620.

As shown in FIG. 12, the thermoelectric conversion module 620 includes a plurality of π-shaped thermoelectric elements 621, which comprises an n-type semiconductor element 622 and a p-type semiconductor element 623, wherein ends of the n-type semiconductor element 622 and the p-type semiconductor element 623 are joined by a metallic electrode 624, arrayed into a plate-like shape, and a plurality of the π-shaped thermoelectric elements 621 are electrically connected in series and thermally connected in parallel by a metallic electrode 625. In the example shown in FIG. 12, when a direct current is allowed to pass in an arrow direction (direction from an n-side toward a p-side in the π-shaped thermoelectric element), heat is absorbed on the upper surface side (an π-junction side of the π-shaped thermoelectric element), and heat is radiated on the bottom surface side. Insulating substrates 626 (for example, ceramic substrates) are joined to the upper surface and the bottom surface to constitute the heat absorbing surface and the heat radiating surface, respectively. It is to be noted that the insulating substrate on the upper surface side is not shown in FIG. 12.

Next, the structure of the liquid cooling block 630 will be described below.

FIGS. 13A to 13D are views for explaining the structure of the liquid cooling block 630. FIG. 13A shows a front view, FIG. 13B shows a side view, and FIG. 13C shows a sectional view. FIG. 13D is a bottom view of an end block described below.

As shown in FIGS. 13A to 13C, the liquid cooling block 630 includes one main body block 632 and two end blocks 633. The main body block 632 and the end blocks 633 are members integrated with each other to form a liquid passage configured to allow the coolant to pass therethrough.

As shown in FIGS. 13A to 13C, the main body block 632 has substantially a low-profile rectangular-prism-like shape, and has a plurality of (in the example of FIGS. 13A to 13D, nine) through-holes 634 formed therein to extend from one end face (the left side in FIGS. 13A and 13C) toward the other end face (the right side in FIGS. 13A and 13C). The through-holes 634 constitute part of the liquid passage through which the coolant passes.

As shown in FIGS. 13A to 13D, the end block 633 has substantially a narrow rectangular-prism-like shape, and has a through-hole 635 formed on the end portion in a longitudinal direction. A joint is connected to the through-hole 635 to constitute a supply port or a discharge port for the coolant. Furthermore, the end block 633 has a plurality of (in the example of FIGS. 13A to 13D, four) elongated holes (recesses) 636 formed on the surface facing the main body block 632 such that one liquid passage can be formed by the adjacent through-holes 634 communicating with each other when the end block 633 is joined to the main body block 632. As shown in FIG. 13C, two end blocks 633 are disposed such that the through-holes 635 are diagonally located, and the two end blocks 633 are joined to the main body block 632.

By assembling the main body block 632 and the end block 633 having the above-described structures, the liquid passage progressing in a serpentine manner from the joint as the supply port toward the joint as the discharge port is formed inside the liquid cooling block 630. That is, the coolant introduced from the through-hole 635 formed on one of the end blocks 633 is allowed to flow between the two end blocks 633 while the direction of the coolant is alternately changed by 180° every time when the coolant collides with the end block 633, thereby the coolant being allowed to pass toward the through-hole 635 formed on the other end block 633 while alternately flowing in the reverse direction of 180° in a serpentine manner.

Furthermore, as shown in FIG. 13A, the liquid cooling block 630 has the circular and shallow holes 631 formed on the surface facing the pusher 640. As described above, the disc spring holder 671 is fit in the hole 631. The liquid cooling block 630 is pressed in a direction of the thermoelectric conversion module 620 with respect to the pusher 640 by the disc spring 670 mounted on the disc spring holder 671. That is, the liquid cooling block 630 is pressed against the thermoelectric conversion module 620 by the biasing force of the disc spring 670.

Next, the operation of the canned beer cooling apparatus 100 having the above-described configuration will be described below.

As shown in FIGS. 1 and 2, the canned beer 101 to be cooled is set in the canned beer cooling apparatus 100. That is, the canned beer 101 is pushed from one side (the right side in FIG. 1) of the temperature adjustment section 110 to be set into a position shown in FIG. 1. When the canned beer 101 is not set, the diameter of the cylindrical region formed by six temperature adjustment units 111 (heat-transfer blocks 610) is slightly smaller than the diameter of the canned beer 101. In this state, when the canned beer 101 is pushed in, the temperature adjustment units 111 (heat-transfer blocks 610) are pressed outward. Therefore, for the movable temperature adjustment units 111a to 111e, the compression coil springs 680 disposed between the pusher 640 and the holder 650 are compressed, and the temperature adjustment units 111 (heat-transfer blocks 610) slightly move back toward the temperature adjustment unit holding section 112 (holders 650), so that the canned beer 101 is easily set. At this point, because the fixed temperature adjustment unit 111f does not move, the canned beer 101 is set into a predetermined position relative to the fixed temperature adjustment unit 111f. As shown in FIGS. 1 and 2, for the movable temperature adjustment units 111a to 111e, when the canned beer 101 is set into the predetermined position, the pushers 640 are pressed toward the direction of the canned beer 101 by the biasing force of the compression coil springs 680 disposed between the pushers 640 and the holders 650, and thereby the heat-transfer blocks 610 integrated with the pushers 640 are pressed against the side face of the canned beer 101. As a result, a degree of the contact between the heat-transfer blocks 610 and the canned beer 101 is enhanced, and thereby the heat conductivity between the heat-transfer blocks 610 and the canned beer 101 is improved, and further thereby the cooling efficiency can be improved.

When the setting of the canned beer 101 is completed, each of the temperature adjustment section 110 and the rotation driving section 120 is operated. The canned beer 101 abutting on the heat-transfer blocks 610 is cooled by operating the temperature adjustment section 110 (temperature adjustment units 111). That is, the heat-transfer blocks 610 and the canned beer 101 are cooled by allowing the direct current to pass through the thermoelectric conversion modules 620.

At the same time, the temperature adjustment section 110 is rotated together with the canned beer 101 by operating the rotation driving section 120. That is, the rotating shaft 123 is rotated through the driving pulley 127, the belt 126, and the driven pulley 125 by operating the reducer-equipped motor 128, thereby rotating the temperature adjustment section holding section 121 fixed to the rotating shaft 123. As a result, the temperature adjustment section 110 is rotated together with the canned beer 101.

The canned beer 101 is rotated together with the temperature adjustment section 110 while the temperature adjustment section 110 is operated to cool the set canned beer 101. Therefore, generation of a temperature boundary layer near the inner circumferential surface of the canned beer 101 due to the cooling by the cooling temperature adjustment section 110 can be suppressed, and the cooling efficiency can be improved.

When the canned beer cooling apparatus 100 is operated for a predetermined time, the canned beer 101 is rapidly cooled to a desired temperature.

According to the above canned beer cooling apparatus 100, the plural temperature adjustment units 111 that are disposed such that the circumference of the canned beer 101 are covered therewith are simultaneously operated, so that the canned beer 101 can be rapidly cooled.

Furthermore, because the temperature adjustment section 110 is rotated together with the canned beer 101, the generation of the temperature boundary layer near the inner circumferential surface of the canned beer 101 can be suppressed, and the cooling efficiency can be improved to more rapidly cool the canned beer 101.

In this embodiment, not an air cooling system but the liquid cooling system is adopted for the heat dissipation of the thermoelectric conversion modules 620, so that the compact apparatus (temperature adjustment section 110) can be constructed.

Although an embodiment of the present invention is described above, obviously the present invention is not limited to the above embodiment. For example, while the substantially a whole area of the side face of the canned beer is covered with the six temperature adjustment units 111 in the above embodiment, the number of temperature adjustment units may be changed or a partial area of the side face of the canned beer may be covered with the temperature adjustment units depending upon the necessary cooling performance. For example, the three temperature adjustment units 111 may be disposed at equal intervals around the canned beer, thereby covering substantially a half area of the side face of the canned beer.

In the above-mentioned embodiment, the canned beer is cooled by way of example. Obviously, the present invention can be applied to the cooling of other packaged beverages such as canned juice, and the present invention can be applied to not only the cooling but also warming. For example, when the electric current is allowed to pass reversely through the thermoelectric conversion module, the heat absorbing surface and the heat radiating surface are reversed, so that the packaged beverage can be warmed without changing the above-described structures.

What is claimed is:

1. A packaged beverage temperature adjustment apparatus comprising:
    a temperature adjustment section configured to hold a packaged beverage, and adjust a temperature of the packaged beverage;
    a rotation driving section capable of continuously rotating the temperature adjustment section, the rotation driving section including a rotating shaft;
    a slip ring for supplying an electric power to the temperature adjustment section, the slip ring being mounted on the rotating shaft; and
    a rotary joint for supplying a coolant for heat dissipation to the temperature adjustment section and recovering the coolant used in the temperature adjustment section from the temperature adjustment section, the rotary joint being mounted on the rotating shaft;

the temperature adjustment section including;

a plurality of temperature adjustment units, the plurality of temperature adjustment units being disposed around the packaged beverage to abut on a side face of the packaged beverage; wherein each of the plurality of temperature adjustment units includes:

a heat-transfer member for abutting on said side face of said packaged beverage;

a thermoelectric conversion module having one surface thermally contacting the heat-transfer member; and a liquid cooling member thermally contacting the other surface of the thermoelectric conversion module, wherein the electric power is supplyable to the thermoelectric conversion module through the slip ring while the temperature adjustment section is rotated continuously, and the coolant is supplyable to and recoverable from the liquid cooling member through the rotary joint while the temperature adjustment section is rotated continuously.

2. The packaged beverage temperature adjustment apparatus according to claim 1, wherein a whole side face of the packaged beverage is covered with the plurality of temperature adjustment units.

3. The packaged beverage temperature adjustment apparatus according to claim 1, wherein the plurality of temperature adjustment units abut on a side face of the packaged beverage, whereby the temperature adjustment section holds the packaged beverage.

4. The packaged beverage temperature adjustment apparatus according to claim 2, wherein the plurality of temperature adjustment units abut on a side face of the packaged beverage, whereby the temperature adjustment section holds the packaged beverage.

5. The packaged beverage temperature adjustment apparatus according to claim 1, wherein at least one of the plurality of temperature adjustment units further includes a holder configured to hold the heat-transfer member movably in a back-and-forth manner.

6. The packaged beverage temperature adjustment apparatus according to claim 5, wherein the at least one of the plurality of temperature adjustment units further includes a biasing portion configured to bias the heat-transfer member in a direction of the packaged beverage.

7. The packaged beverage temperature adjustment apparatus according to claim 2, wherein at least one of the plurality of temperature adjustment units further includes a holder configured to hold the heat-transfer member movably in a back-and-forth manner.

8. The packaged beverage temperature adjustment apparatus according to claim 7, wherein the at least one of the plurality of temperature adjustment units further includes a biasing portion configured to bias the heat-transfer member in a direction of the packaged beverage.

9. The packaged beverage temperature adjustment apparatus according to claim 3, wherein at least one of the plurality of temperature adjustment units further includes a holder configured to hold the heat-transfer member movably in a back-and-forth manner.

10. The packaged beverage temperature adjustment apparatus according to claim 9, wherein the at least one of the plurality of temperature adjustment units further includes a biasing portion configured to bias the heat-transfer member in a direction of the packaged beverage.

* * * * *